(12) United States Patent
Dabral et al.

(10) Patent No.: US 6,507,219 B2
(45) Date of Patent: *Jan. 14, 2003

(54) CHARGE SHARING AND CHARGE RECYCLING FOR AN ON-CHIP BUS

(75) Inventors: Sanjay Dabral, Milpitas, CA (US); Ming Zeng, San Jose, CA (US); Subramaniam Maiyuran, Fair Oaks, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/962,716

(22) Filed: Sep. 21, 2001

(65) Prior Publication Data

US 2002/0017922 A1 Feb. 14, 2002

Related U.S. Application Data

(63) Continuation of application No. 09/368,639, filed on Aug. 4, 1999, now Pat. No. 6,356,115.

(51) Int. Cl.[7] .............................................. H03K 19/094
(52) U.S. Cl. .............................. 326/86; 326/30; 326/90; 326/98; 327/28; 327/77; 327/379; 365/203; 365/205; 365/207
(58) Field of Search .............................. 326/17, 20, 30, 326/31, 86, 90, 96, 98; 327/28, 77, 379; 365/207, 205, 203

(56) References Cited

U.S. PATENT DOCUMENTS 5,982,688 A * 11/1999 Han ........................... 365/203

* cited by examiner

*Primary Examiner*—Michael Tokar
*Assistant Examiner*—Vibol Tan
(74) *Attorney, Agent, or Firm*—Kenyon & Kenyon (57) ABSTRACT

A method for charge sharing among data conductors of a bus. The bus has a first data conductor and a corresponding data conductor. The method includes detecting the logic levels on the first data conductor and the corresponding data conductor, and generating a charge sharing signal for sharing charge between the first data conductor and the corresponding data conductor.

27 Claims, 8 Drawing Sheets

CHARGE SHARING AND CHARGE RECYCLING FOR AN ON-CHIP BUS

This application is a Continuation of prior application Ser. No. 09/368,639, filed Aug. 4, 1999 now U.S. Pat. No. 6,356,115.

FIELD OF THE INVENTION

The present invention pertains to the field of integrated circuits. More particularly, the present invention pertains to sharing and recycling charge or sharing charge for a bus.

BACKGROUND OF THE INVENTION

Many integrated circuits communicate multiple bits of digital data in parallel using an internal data bus having a set of parallel conductors to which multiple circuit functions are connected. In particular, processors have an internal data bus for communicating among circuits such as arithmetic logic units, fetch units, floating point units, and graphics units. As processor clock speeds have increased, there has been greater demand for faster internal bus speeds.

In modern processors, the series resistance and parasitic capacitance (collectively known as the RC distributed load) of relatively long conductors, such as data bus lines, can become a significant factor in the operating performance of the processor because the parasitic resistance-capacitance affects the time required for the conductor to switch from one digital state to the other. Furthermore, as processor circuits become increasingly dense, the cross-sectional area allowable for the data bus conductors decreases, in turn increasing the resistance of the data bus conductors and increasing the time constant of its switching, particularly if the data bus conductor must fully switch between ground and the power supply voltage (i.e., from "rail to rail").

Of course, the increased RC distributed load of the data bus conductors can be overcome to some degree by increasing the size of the transistors of the drivers (drive transistors) that drive the bus. Increases in the size of transistors runs counter to the desire to efficiently use processor die space by densely populating the die. Furthermore, the incremental gains in speed diminish rapidly beyond a certain driver size. Additionally, where there may be multiple drivers connected to the bus because of each functional circuit's need to communicate with other circuits, the RC distributed load of the data bus may be very large because of the added capacitance of the drivers themselves. In some cases, the RC distributed load of the data bus may be too great for any reasonably sized driver to meet the desired switching time from rail to rail.

A method for decreasing the switching time from rail to rail has been described in U.S. Pat. No. 5,295,104 to McClure. McClure describes a data bus having data bus conductors placed in parallel with dummy data bus conductors. During the driving of the data bus, each data bus conductor and its corresponding dummy data bus conductor are complementarily charged (i.e., charged to logic complements of each other). Prior to the next cycle, the data bus conductors and the dummy data bus conductors are connected together so that, by way of charge sharing, the true data conductor is charged to a midlevel voltage. To ensure proper charge of the data conductors, each of the dummy data conductors preferably physically resembles one of the data conductors, having substantially the same length and cross-sectional area, and being formed of the same material. Unfortunately, using dummy data conductors that could take up precious space may be an inadequate solution for today's densely populated integrated circuits, including processors, which are routing limited. Additionally, because of the additional need to drive a dummy data conductor the area allocated to drivers has to be increased over the case where only a data conductor is driven.

Also, dummy conductors may waste significant amounts of power and produce unnecessary heat. Power consumption is a major issue in many computer applications, especially mobile computing. Additionally, heat and its dissipation are significant considerations among processor manufacturers because heat may contribute to destructive failures and improper operation.

SUMMARY OF THE INVENTION

According to an embodiment of the invention a method of charge sharing is described. The method includes detecting the logic level of two data conductors and generating a sharing signal for sharing charge between the two data conductors.

BRIEF DESCRIPTION OF THE DRAWINGS

The present invention is illustrate d by way of example, and not limitation, in the figures of the accompanying drawings in which.

DETAILED DESCRIPTION

A method and apparatus for sharing and recycling charge or sharing charge among data conductors in a bus of a circuit is described below. In the following description, for purposes of explanation, numerous specific details are set forth in order to provide a thorough understanding of the present invention. It will be evident, however, to one skilled in the art that the present invention may be practiced without these specific details.

Various operations will be described as multiple discrete operations performed in turn in a manner that is most helpful in understanding the present invention. However, the order of description should not be construed as to imply that these operations are necessarily performed in the order that they are presented, or even order dependant. Lastly, repeated usage of the phrases "in one embodiment," "in an embodiment," "an alternative embodiment," or "an alternate embodiment" does not necessarily refer to the same embodiment, although it may. While in the description below the invention is described as having an integrated circuit or processor implementation, there is nothing to prevent the invention from being practiced in off-chip implementations such as a computer bus or system-level bus.

Figure 1:
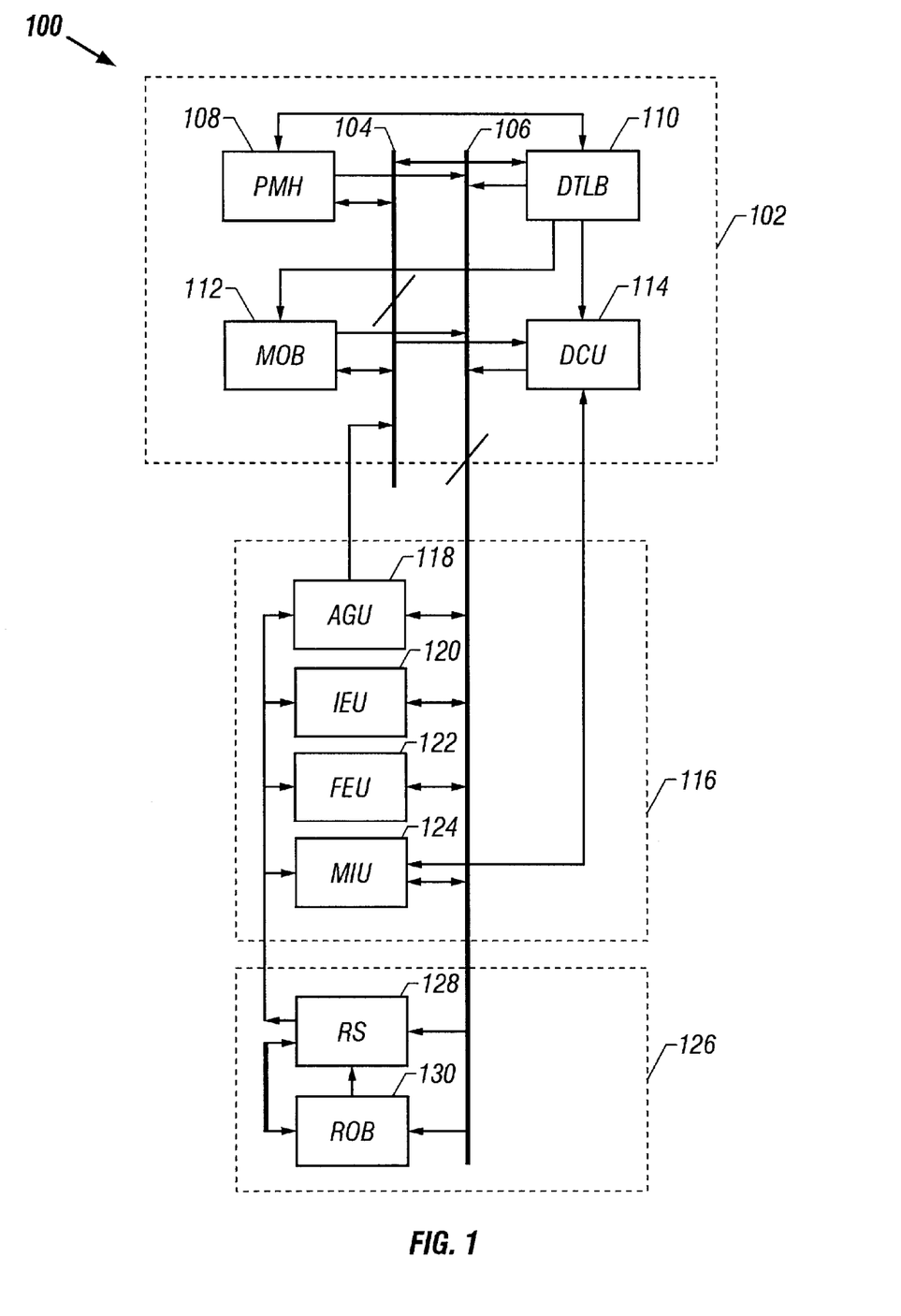
FIG. 1 illustrates an example of a circuit into which an embodiment of the present invention may be incorporated.

FIG. 1 illustrates an example of a circuit into which an embodiment of the present invention may be incorporated. In this example, processor 100 may have some, none, or all of the following characteristics: high density, large circuit area, long data conductors, or high bus speed. While this invention has particular utility in integrated circuits having any of the four aforementioned characteristics, it should not be limited to such circuits. Processor 100 includes functional blocks such as memory cluster (MC) 102, execution cluster (EC) 116, and 000 cluster (OC) 126. While processor 100 includes the aforementioned functional blocks, it is apparent that the present invention should not be limited to processors having such blocks. Moreover, it should be apparent that the present invention should not be limited to processors but may be profitably employed in a variety of integrated circuits, including memories and other chips having buses.

Returning to the description of processor 100, MC 102 provides functional units used for caching of frequently accessed data and accessing external memory (not shown). External memory contains data and instructions for execution by processor 100. EC 116 provides functional units for executing instructions requiring integer, floating point and address calculations. OC 126 provides functional units for issuing instructions to EC 116 and retiring instructions executed by the functional units of EC 116. Instructions issued by OC 126 are retrieved from external memory using MC 102. The functional blocks 102, 112 and 126 are coupled to each other via internal bi-directional bus 104 and 106.

MC 102 includes page miss handler (PMH) 108, data transmission look aside buffer (DTLB) 110, memory ordering buffer (MOB) 112, and data cache unit (DCU) 114. DTLB 110 translates a virtual memory address into a physical address for accessing a location in external memory. DCU 114 contains frequently accessed data used by processor 100. The data stored in DCU 114 are retrieved from external memory. MOB 112 does load/store ordering for memory accesses. In some situations for a parallel processor, even though a program sequence has a write (store) instruction to a memory location ahead of a read (load) instruction from the same memory location, the read instruction may issue before the write instruction. In such a situation, it is desirable to have the read access wait until the write access to memory has occurred. MOB 112 reorders issued load and store instructions so that the program sequence is safeguarded at the time of accessing memory.

PMH 108 and MOB 112 are coupled to each other via internal bi-directional bus 104. DTLB 110 and DCU 114 are coupled to each other via internal bi-directional bus 106. Bus 104 and bus 106 are described in further detail below. Buses 104 and 106 each has multiple lines.

MC 102 is coupled to OC 126 via bus 106. OC 126 includes reservation station (RS) 128 and reorder buffer (ROB) 130. OC 126 is coupled to EC 116 via bus 106. RS 128 dispatches instructions to EC 116 for execution. ROB 130 retires instructions after it receives notification that they have been executed by EC 116.

Depending on the particular type of instruction issued by RS 128, the instruction is sent to the appropriate unit in EC 116. EC 116 includes address generation unit (AGU) 118, integer execution unit (IEU) 120, floating point execution unit (FU) 122, and memory interface unit (MIU) 124. AGU 118 calculates addresses for memory access (load or store) instructions. IEU 120 performs integer calculations. FU 122 performs floating point calculations. MIU 124 translates floating point representations between the format used internally within processor 100 and outside processor 100.

Bus 104 and bus 106 have data conductors (not shown) that can range up to 25,000 microns in length and possibly even longer. Due to the long lengths, the small cross-sectional area of the conductors, or parasitic capacitances, it may be difficult, as switching times decrease, to quickly change the voltage levels on the conductors in order for the various functional units to communicate among each other. The inability to quickly change the voltage levels (rail to rail) of an interconnect, among other factors, limits the performance achievable by processor 100. For example, if a conductor has a high voltage and the next datum being placed on the conductor requires the conductor to have a low voltage, the conductor has to be discharged by a significant amount. Additionally, if a conductor has a low voltage and the next datum being placed on the conductor requires a high voltage, the conductor has to be charged by a significant amount. It may be beneficial to drive data conductors to either rail voltage from a voltage substantially midway between the rails. Getting a data conductor to a voltage substantially midway between the rails before driving them it is described below.

Figure 2A:
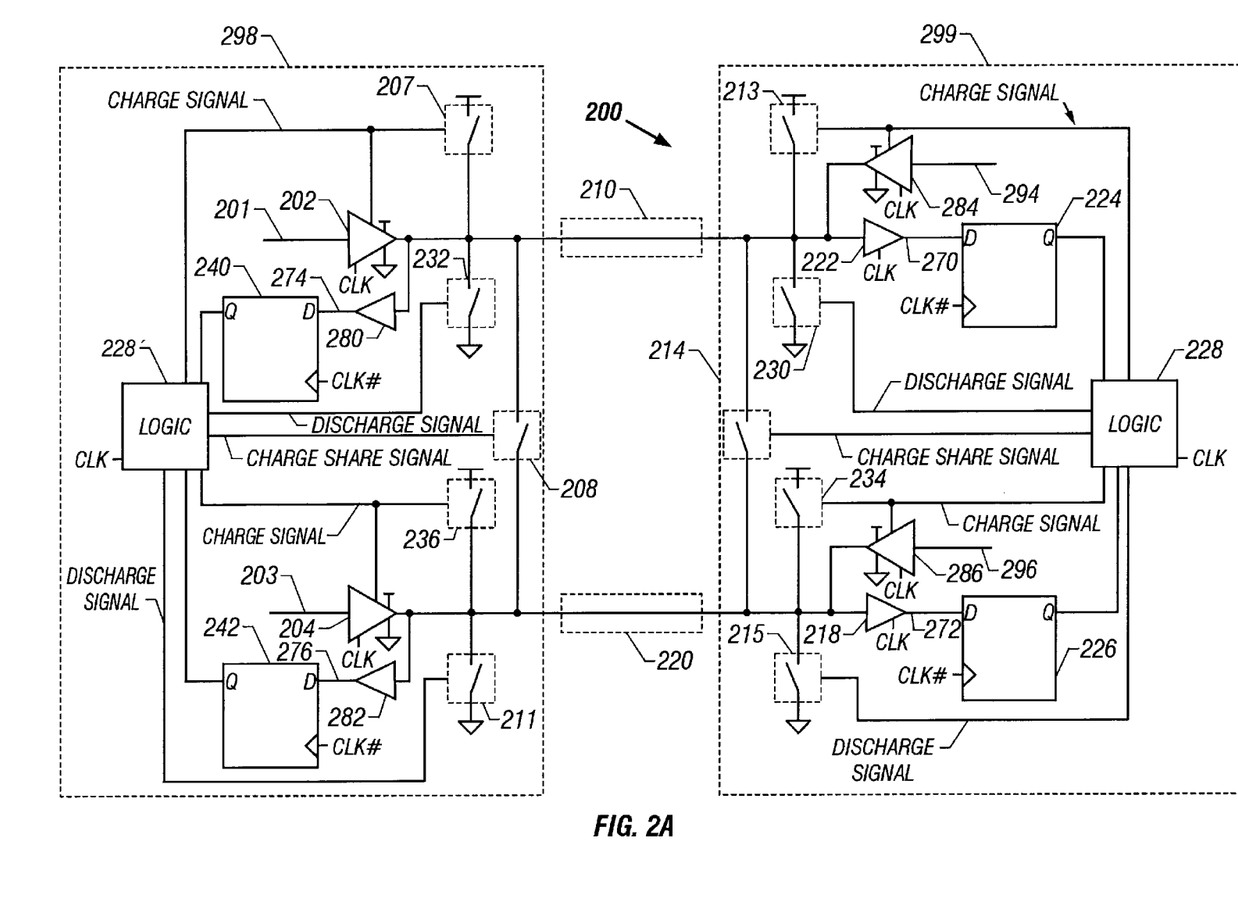
FIG. 2a is an electrical diagram in block form illustrating data bus conductors in accordance with this invention.

FIG. 2a is an electrical diagram, in block form, showing conductor pair 200 having two data bus conductors in accordance with this invention. It should be apparent that the relative size of the elements shown in FIG. 2a is not necessarily indicative of the true relative or absolute size of the elements in an application of this invention. Conductor pair 200 is representative of a pair of bi-directional conductors in bus 104 or bus 106 of FIG. 1. While in this embodiment conductor pair 200 is bi-directional, it should be apparent that this invention can be practiced with one-way buses. Conductor pair 200 allows functional units described in connection with FIG. 1 to communicate with each other. While conductor pair 200 shows only a first data conductor 210 and a corresponding data conductor 220, it should be apparent that this invention is not limited to two data bus conductors but can be used with any number of conductors. Conductor pair 200 also includes drivers 202, 204, 284, and 286, data lines 201, 203, 294 and 296, switches 207, 208, 211, 213, 214, 215, 230, 232, 234, and 236, receivers 218, 222, 280 and 282, flip flops (or latches) 224, 226, 240, and 242, receiver lines (lines) 270, 272, 274 and 276, and control logic units (or logic) 228 and 228'. Part of conductor pair 200 resides in functional unit (FU) 298, and a portion resides in functional unit (FU) 299. Data conductors 210 and 220 couple FU 298 and FU 299.

When FU 298 communicates with FU 299, drivers 202 and 204 of FU 298 drive data placed on data lines 201 and 203, respectively, onto first data conductor 210 and corresponding data conductor 220, respectively. Drivers 202 and 204 each receive a clock signal generated by a clock generator (not shown) that enables the drivers to output the data received from lines 201 and 203, respectively, when the clock signal is high. FIG. 2c illustrates a timing diagram for the operation of conductor pair 200. When the clock is high, data is driven onto conductors 210 and 220. Driving data onto conductors 210 and 220 will either cause the voltage levels on the conductors to go to a high logic level or a low logic level. Typically, the high logic level is associated with a high charge level meaning that the conductor has a relatively higher charge on it than the low charge level of the low logic level. It should be readily apparent to one of ordinary skill in the art that charge levels are related to voltage levels, and that measurement of one is related to the measurement of the other.

Receivers 218 and 222 of FU 299 sense the data placed upon first conductor 220 and corresponding conductor 210, respectively, and generate signals for application to flip flops (or latches) 226, and 224, respectively. Flip flops 224 and 226 are coupled to receivers 222 and 218 via lines 270 and 272, respectively. Flip flops 224 and 226 store the state (or logic level) of the data placed by drivers 202 and 204 onto conductors 210 and 220 while the clock was high, thereby allowing conductors 210 and 220 to be prepared for new data. The state or logic level is indicative of the charge level placed on the conductors. While conductors 210 and 220 are being prepared for new data, flip flops 224 and 226 provide the state of conductors 210 and 220 while the clock signal was clock high to logic 228 and other elements (not shown) of FU 299.

Similarly, receivers 280 and 282 of FU 298 sense the data placed upon first conductor 210 and corresponding conductor 220 and generate signals for application to flip flops (or latches) 240, and 242, respectively. Flip flops 240 and 242 are coupled to receivers 280 and 282 via lines 274 and 276, respectively. Flip flops 240 and 242 provide the state of conductors 210 and 220 while the clock signal was clock high to logic 228' and other elements (not shown) of FU 298.

Control logic 228 and 228' detect the logic levels (or charge levels) of the conductors by reading the flip flops. Depending on the charge levels (or logic states) of conductors 210 and 220, control logic 228 and 228' generate appropriate signals for application to the switches and drivers in the respective functional unit in which each logic unit resides. There are four combinations of charge levels that conductors 210 and 220 can have. The operation of conductor pair 200 will be first described for the case where conductors 210 and 220 both have been driven to a low charge level. Then the operation for the case where conductors 210 and 220 are both driven to a high charge level will be described. Finally, the operation for the case where conductor 210 is driven to a high charge level and conductor 220 is driven to a low charge level will be described. The operation of the fourth combination, the case where conductor 210 is driven to a low charge level and conductor 220 is driven to a high charge level, should be apparent from description of the operation of the third combination above.

If, after the clock signal goes to clock low, flip flops 224, 226, 240 and 242 indicate that both conductors 210 and 220 had been driven so as to have a low charge level, logic 228 generates a charge signal for application to switch 213 and driver 284. The charge signal will turn on switch 213 and driver 284 to create a conductive path between conductor 210 and the voltage supply (not shown), charging up conductor 210 to the potential of the voltage supply. The use of drivers shown FIG. 2a to charge up conductor 210 will be described below. Logic 228 also generates a discharge signal for application to switch 215 and driver 286. The discharge signal creates a conductive path between conductor 220 and system ground (not shown), discharging conductor 220 to the potential of the system ground. The use of drivers shown in FIG. 2a to discharge conductor 220 will be described below.

Control logic 228' generates a charge signal for application to switch 207 and driver 202 so that they will charge up conductor 210 to the potential of the voltage supply. Logic 228' also generates a discharge signal for application to switch 211 and driver 204 so that they will discharge conductor 220 to the potential of system ground.

In this embodiment of the invention, conductor 220 is discharged to the potential of system ground. Discharging conductor 220 is preferable to leaving conductor 220 at some uncertain charge around the low charge level. By charging conductor 210 to the potential of the voltage supply and discharging conductor 220 to the potential of the system ground better control can be achieved over the amount of charge that will be left on each conductor after charge sharing (described below). Otherwise, sharing will occur between a conductor charged up to the voltage supply and a conductor with an uncertain charge close to the low charge level. While in this embodiment conductor 220 is further discharged when it already has a low charge level, alternative embodiments in accordance with this invention may not discharge conductor 220 when it already has a low charge level. In such alternative embodiments, switches 211 and 215 may be missing and drivers 203 and 286 may not be of the kind that can discharge conductor 220.

After charging and discharging is complete, logic 228 produces a charge sharing signal for application to switch 214. Logic 228' produces a charge sharing signal for application to switch 208. The charge sharing signal creates a conductive path between conductors 210 and 220 allowing conductor 210 to share its charge with conductor 220. For neighboring conductors the capacitances are roughly equal. Consequently, the voltage level after charge sharing is substantially midway between the rail voltages.

The operation of conductor pair 200 will now be described for the case where both conductors 210 and 220 have been driven to a high charge level. If, after the clock signal goes to clock low, flip flops 224, 226, 240, and 242 indicate that both conductors 210 and 220 had been driven so as to have a high charge level, logic 228 generates a charge signal for application to switch 213 and driver 284. The charge signal will turn on switch 213 and driver 284 to create a conductive path between conductor 210 and the voltage supply (not shown), charging up conductor 210 to the potential of the voltage supply. Logic 228 also generates a discharge signal for application to switch 215 and driver 286. The discharge signal creates a conductive path between conductor 220 and system ground (not shown), discharging conductor 220 to the potential of the system ground.

Control logic 228' generates a charge signal for application to switch 207 and driver 202 so that they charge up conductor 210 to the potential of the voltage supply. Logic 228' also generates a discharge signal for application to switch 211 and driver 204 so that they discharge conductor 220 to the potential of system ground.

In this embodiment of the invention, conductor 210 is charged to the potential of the voltage supply. Charging conductor 210 is preferable to leaving conductor 210 at some uncertain charge around the high charge level. By charging conductor 210 to the potential of the voltage supply and discharging conductor 220 to the potential of the system ground better control can be achieved over the amount of charge that will be left on each conductor after charge sharing (described below). Otherwise, sharing will occur between a conductor discharged to the potential of system ground and a conductor with an uncertain charge close to the high charge level. While this embodiment has conductor 210 charged to the potential of the voltage supply using two switches and two drivers, alternative embodiments may use fewer drivers and switches. Furthermore, in alternative embodiments, conductor 210 may not even be charged to the supply voltage when conductor 210 has a high charge level.

After charging and discharging are completed, logic 228 produces a charge sharing signal for application to switch 214. Logic 228' produces a charge sharing signal for application to switch 208. The charge sharing signal will open conductive paths between conductors 210 and 220 allowing conductor 210 to share its charge with conductor 220. The description above of the charge sharing between conductors 210 and 220 is incorporated herein and need not be repeated.

The operation of conductor pair 200 will now be described for the situation when, after clock signal goes to clock low, flip flops 224 and 240 indicate that conductor 210 has been driven to a high charge level and flip flops 226 and 242 indicate that conductor 220 has been driven to a low charge level. Logic 228 generates a charge signal for application to switch 213 and driver 284. Logic 228' generates a charge signal for application to switch 207 and driver 202. The charge signals turn on switches 207 and 213 and drivers 202 and 284 so as to achieve a conductive path between conductor 210 and the voltage supply. Logic 228 generates a discharge signal for application to switch 215 and driver 286. Similarly, logic 228' generates a discharge signal for application to switch 211 and driver 204. The discharge signals turn on switches 211 and 215 and drivers 286 and 204 so as to achieve a conductive path between conductor 220 and ground that discharges conductor 220 to the potential of the system ground.

In this embodiment of the invention, conductor 210 is charged to the potential of the voltage supply and conductor 220 is discharged to the potential of the system ground. Charging conductor 210 is preferable to leaving conductor 210 at some uncertain charge around the high charge level. Similarly, discharging conductor 220 is preferable to leaving conductor 220 at some uncertain charge around the low charge level. By charging conductor 210 to the potential of the voltage supply and discharging conductor 220 to the potential of the system ground better control can be achieved over the amount of charge that will be left on each conductor after charge sharing (described below). Otherwise, sharing will occur between a conductor with an uncertain charge close to the high charge level and another conductor with an uncertain charge close to the low charge level. While in this embodiment conductor 220 is further discharged when it already has a low charge level, alternative embodiments in accordance with this invention may not discharge conductor 220 when it already has a low charge level. In such alternative embodiments, switches 211 and 215 may be missing and drivers 203 and 286 may not be of the kind that can discharge conductor 220.

After charging and discharging are completed, logic 228 produces a charge sharing signal for application to switch 214. Logic 228' produces a charge sharing signal for application to switch 208. The charge sharing signal will open conductive paths between conductors 210 and 220 allowing conductor 210 to share its charge with conductor 220. The description above of the charge sharing between conductors 210 and 220 is incorporated herein and need not be repeated.

While this embodiment has been described with certain features, it should be apparent that the invention should not be so limited. Alternative embodiments may have different, less or more features and remain within the scope of this invention. Some alternative embodiments are identified below. It should be apparent that the alternative embodiments identified below are not an exhaustive list. For example, while FIG. 2c shows certain operations being performed while the clock signal has certain levels, it should be apparent that the same functionality can be achieved by an alternative embodiment having a clock signal that is the inverse of the clock signal shown in FIG. 2c.

While in FIG. 2a conductors 210 and 220 are shown between two functional units, it should be apparent that additional functional units may be coupled to the conductors. Additionally, while in this embodiment each of the functional units has its own control logic unit, alternative embodiments in accordance with this invention may have functional units without their own dedicated control logic unit. Nevertheless, it is beneficial to have each of the functional units have its own control logic unit for generating a charge signal (and other signals described below) for application to switches and drivers within the respective functional unit. Having a control logic unit within each functional unit decreases control line routing problems to switches and drivers that are spread out across the processor. Additionally, problems (e.g., timing) with getting a signal to a driver or switch at the proper time can be avoided.

While this embodiment has been described with two switches and two drivers performing the charging, it should be apparent that in alternative embodiments in accordance with this invention more switches and drivers, at multiple locations along a conductor, or fewer switches and drivers may be used. Additionally, in alternative embodiments, there may be no distinct switches because a driver (such as the one described below in connection with FIG. 3b) can provide such a functionality. FIG. 2c illustrates that when the clock signal is at clock low, the charging occurs for a fraction of the time that the clock signal is at clock low. The duration of the charging is a function of the size/strength of the switches and the combined resistive and capacitive (RC) distributed load of conductor 210, among other factors. The duration of charging is also a function of the number of switches and drivers that are placed at multiple locations along the conductor. For switches of equivalent size and drivers of equivalent strength, increasing numbers of switches and drivers usually means less time spent charging.

While this embodiment has been described with two switches and two drivers performing the discharging, it should be apparent that in alternative embodiments more switches and drivers, at multiple locations along a conductor, or fewer switches and drivers may be used. FIG. 2c illustrates that when the clock signal is at clock low, the discharging occurs for a fraction of the time that the clock signal is at clock low. The duration of the discharging is a function of the number and size/strength of switches or drivers and the combined resistive and capacitive (RC) distributed load of the conductor. The duration of discharging is also a function of the number of switches and drivers that are placed at multiple locations along the conductor. For switches of equivalent size and drivers of equivalent strength, increasing numbers of switches and drivers usually means less time spent discharging.

While this embodiment has been described with two switches performing charge sharing, it should be apparent that in alternative embodiments more switches, at multiple locations along a conductor, or fewer switches may be used. FIG. 2c illustrates that when the clock signal is at clock low and after charging has occurred, the charge sharing occurs for a fraction of the time that the clock signal is at clock low. The duration of charge sharing is a function of the number and size/strength of switches or drivers and the combined resistive and capacitive (RC) distributed load of the conductors, among other factors. The duration of charge sharing is also a function of the number of switches are placed at multiple locations between conductor 210 and conductor 220. While this embodiment has been described with two switches performing the charge sharing, it should be apparent that more switches, at multiple locations, or fewer switches can be used. For switches of equivalent size, increasing numbers of switches usually means relatively less time needed for charge sharing. Preferably, after charge sharing conductors 210 and conductors 220 have a voltage that is close to the trip point of receivers 218 and 222, respectively. By having a voltage that is close to the trip point of receivers 218 and 222, conductors 210 and conductors 220 can later be rapidly and efficiently driven to the desired charge level by the drivers.

While in this embodiment conductors were charged to the voltage supply and were discharged to system ground in order to better control the amount of charge left on each conductor after charge sharing, alternative embodiments may choose to forgo making these adjustments in the charge level of the conductors. For example, alternative embodiments may not discharge and charge conductors when the conductors already have complementary charge levels. Additionally, when both conductors are at a low charge, an alternative embodiment may only charge one conductor up to the voltage supply and leave the other conductor at a low charge. When both conductors are at a high charge, an alternative embodiment may only discharge one conductor to the low charge and leave the other conductor at a high charge.

While in this embodiment there was an even number of conductors, this invention should not be limited to buses having an even number of conductors. In an alternative embodiment of this invention, a bus may have an odd number of conductors. The conductor that remains after all the other conductors have been paired up may be paired up with a dummy data conductor or a dummy capacitor. The dummy data conductor or dummy capacitor may be driven to either a high or low charge level during the driving cycle. Additionally, the dummy conductor or dummy capacitor is involved in charge sharing in the same manner as the other data conductor.

Figure 2B:
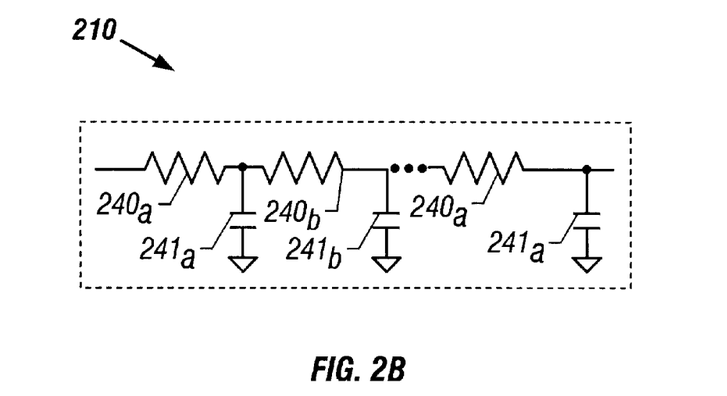
FIG. 2b illustrates a circuit diagram representation of the electrical characteristics of data conductors in an embodiment of the present invention.
Figure 2C:
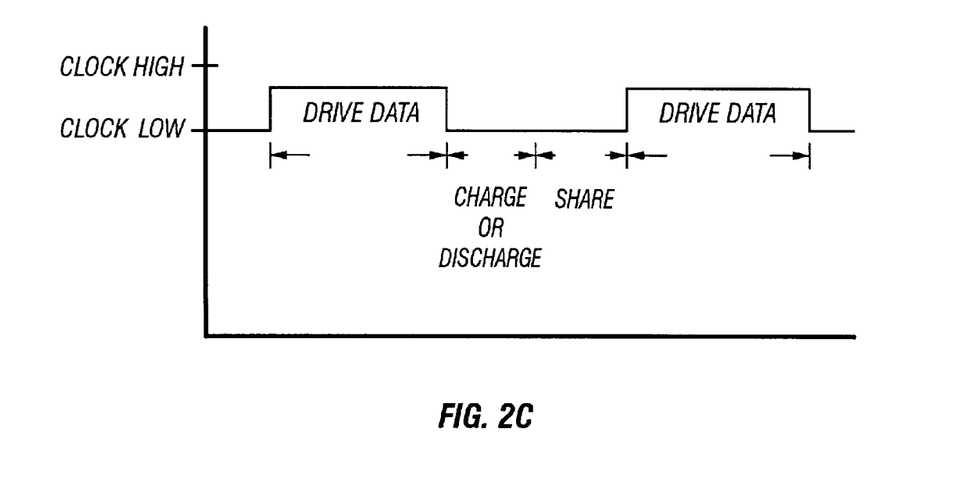
FIG. 2c illustrates a timing diagram for the operation of two conductors in an embodiment of the present invention.

FIG. 2b illustrates a circuit diagram representation of the distributed electrical characteristics of conductors 210 and 220. It should be apparent that other circuit diagram representations of the electrical characteristics of data conductors are possible. This invention is not limited to any particular circuit diagram representation of electrical characteristics of data conductors. FIG. 2b shows that conductor 210 (or conductor 220) can be represented by a repeating pattern of a basic unit formed from a resistor and a capacitor. The speed with which conductor 210 (or conductor 220) can be charged or discharged is a function of the magnitude of the values of resistor $240_a$, capacitor $241_a$, resistor $240_b$, capacitor $241_b$, and any intermediate resistors and capacitors up to and including resistor $240_n$ and capacitor $241_n$. The magnitude of the values of the resistors and capacitors is a function of the length and cross-sectional area of conductor 210 (or conductor 220), and the proximity, and shape of other material nearby with which a conductor can have a capacitive interaction.

Figure 3A:
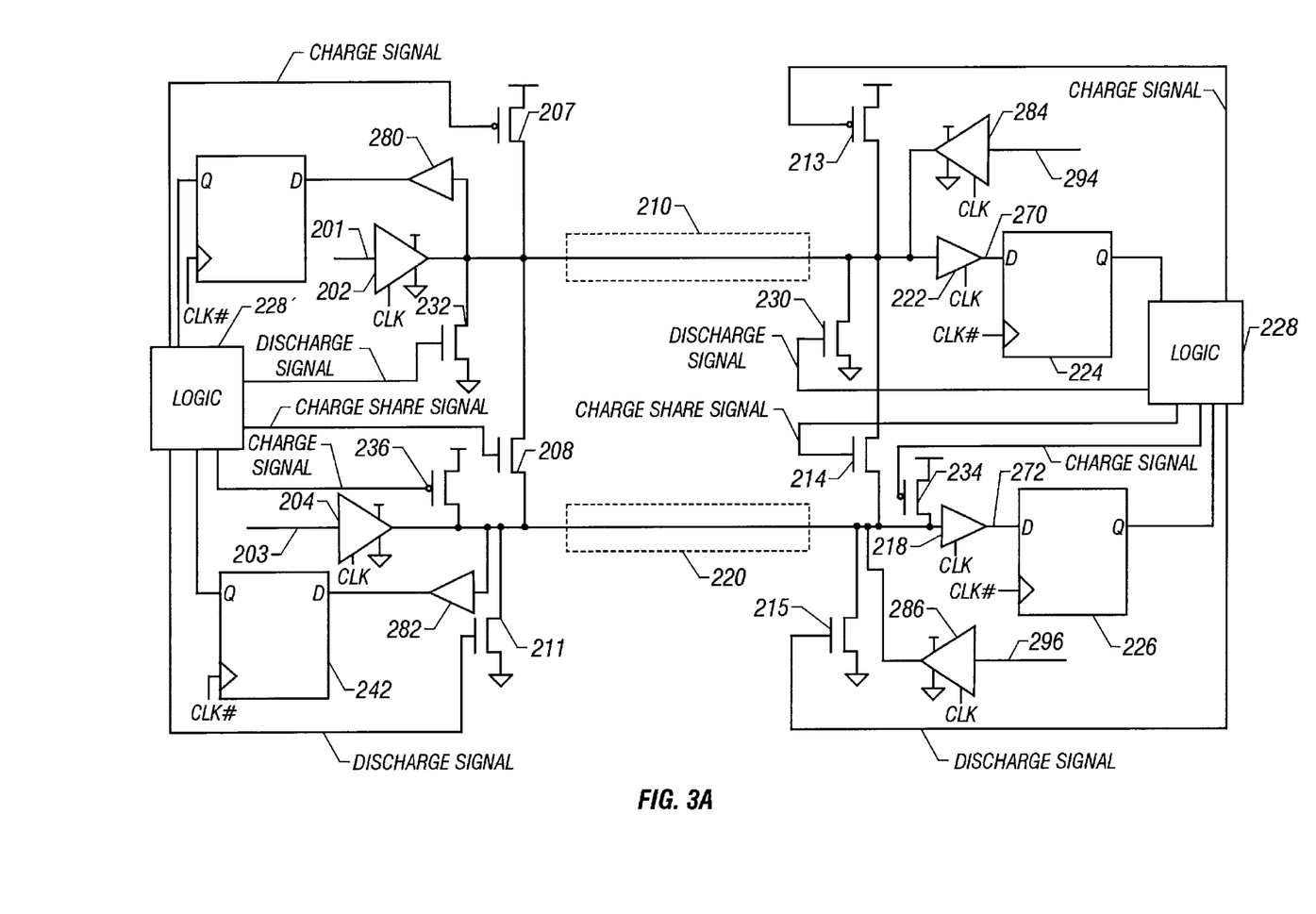
FIG. 3a illustrates an electrical diagram in schematic form of data conductors in accordance with this invention.

FIG. 3a illustrates an electrical diagram in schematic form of bus data conductors in accordance with this invention. In FIG. 3a, switches 207, 213, 234 and 236 are shown as PMOS (p-type metal oxide semiconductor) transistors receiving a charging signal. It should be apparent that other types of transistors or switching devices can be used instead of PMOS transistors. Continuing with FIG. 3a, switches 208 and 214 are shown as NMOS (n-type metal oxide semiconductor) transistors receiving a charge sharing signal. In an alternative embodiment, these switches can be pass gates. Switches 211, 215, 230 and 232 are NMOS transistors receiving a discharge signal. It should be apparent that other types of transistors or switching devices can be used instead of NMOS transistors.

Figure 3B:
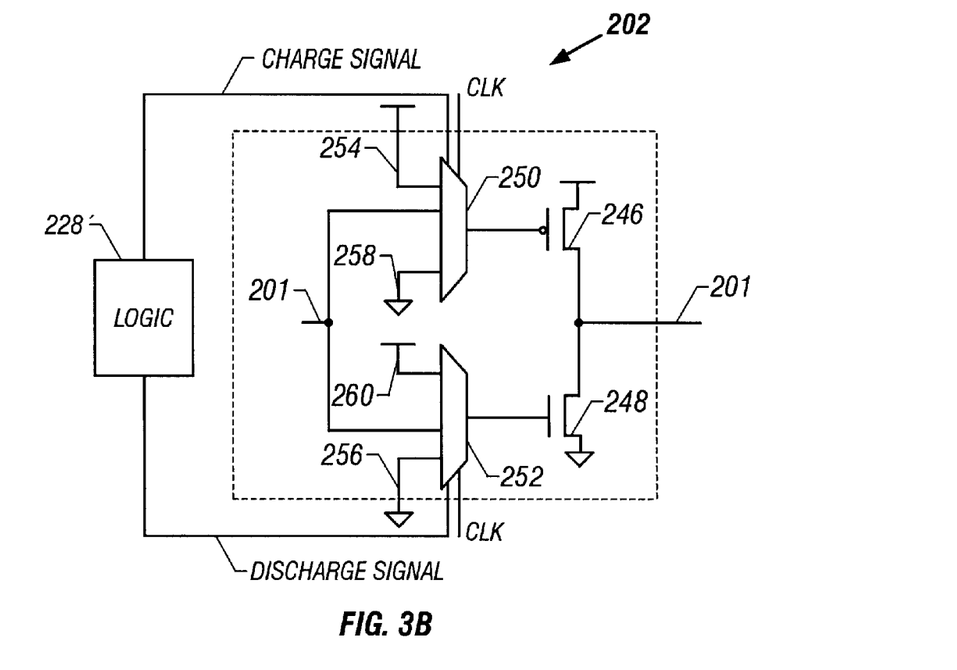
FIG. 3b is an electrical diagram in schematic form of a data driver in an embodiment of this invention.

FIG. 3b is an electrical diagram in schematic form of a driver in accordance with this invention. It should be apparent that this invention is not limited to the driver described herein. The driver 202 of FIG. 3b is also representative of drivers 204, 294 and 296. While driver 202 is described as charging and discharging data conductor 210, this invention may be practiced with drivers that neither charge nor discharge data conductor 210.

Driver 202 comprises multiplexer 250 and 252 and PMOS transistor 246 and NMOS transistor 248. Multiplexer 250 has a first selection input and a second selection input. The first selection input is coupled to the clock generator and the second selection input is coupled to logic 228'. Multiplexer 250 has three inputs for the voltage supply, system ground and data line 201. Multiplexer 250 has an output that is coupled to the gate of transistor 246. Transistor 246 has a source coupled to the voltage supply and a drain coupled to conductor 210. Multiplexer 252 also has a first selection input and a second selection input. The first selection input is coupled to the clock generator, and the second selection input is coupled to logic 228'. Multiplexer 252 has three inputs for the voltage supply, system ground and data line 201. Multiplexer 252 has an output that is coupled to the gate of transistor 248. Transistor 248 has a drain coupled to conductor 210 and a source coupled to system ground.

During operation, when the clock signal is high, the data placed on line 201 is selected by multiplexers 250 and 252 for application to the gate of transistor 246 and the gate of transistor 248, respectively. When the clock signal is low and logic 228' generates a charge signal, multiplexer 250 selects the input coupled to system ground for application at the output. By applying the system ground to the gate of transistor 246, a conductive path is created between the voltage supply and conductor 210. When the clock signal is low and logic 228' generates a discharge signal, multiplexer 252 selects the input coupled to the voltage supply for application at the output. By the applying the voltage supply to the gate of transistor 248, a conductive path is created between the conductor 210 and system ground. When the clock signal is low and logic 228' neither generates a charge or a discharge signal, multiplexer 250 selects the input coupled to the supply voltage for application to the output, turning off transistor 246. Additionally, multiplexer 252 selects the input coupled to the system ground for application to the output, turning off transistor 248. In this manner, conductor 210 is placed in a tri-state.

Figure 3C:
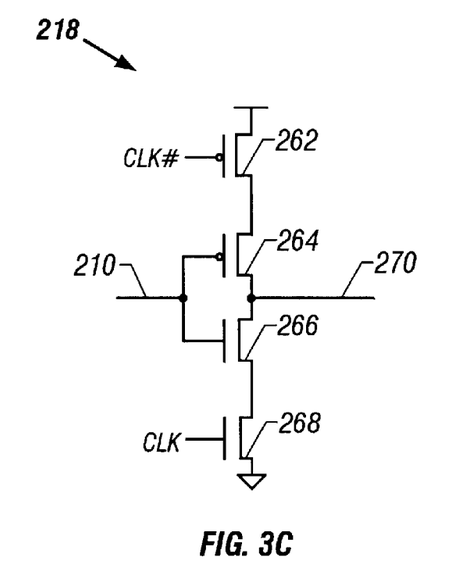
FIG. 3c is an electrical diagram in schematic form of a data receiver in an embodiment of this invention.

FIG. 3c is an electrical diagram in schematic form of receiver 218 in accordance with this invention. Receiver 218 of FIG. 3c is representative of receivers 222, 280, and 282. It should be apparent that this invention is not limited to the receiver described herein, but may be used with comparable receivers operable to detect data communicated on data conductors 210 and 220.

Receiver 218 comprises PMOS transistors 262 and 264 and NMOS transistors 266 and 268. The drain of transistor 262 is coupled to the voltage supply, and the source of transistor 242 is coupled to the drain of transistor 264. The gate of transistor 262 is coupled to the inverse of the clock. The source of transistor 264 is coupled to line 270. The gate of transistor 264 is coupled to conductor 210. The drain of transistor 266 is coupled to line 270, and the source of transistor 266 is coupled to the drain of transistor 268. The gate of transistor 268 is coupled to the clock, and the source of transistor 268 is coupled to the system ground.

During operation, when the clock is high, transistor 262 and transistor 268 are on. If the data on conductor 210 is a logic high, then transistor 266 conducts pulling line 270 to system ground. Transistor 264 does not conduct, isolating line 270 from the voltage supply coupled to transistor 262. When the clock is low, transistor 262 and transistor 268 are off, thereby preventing leakage.

Figure 4:
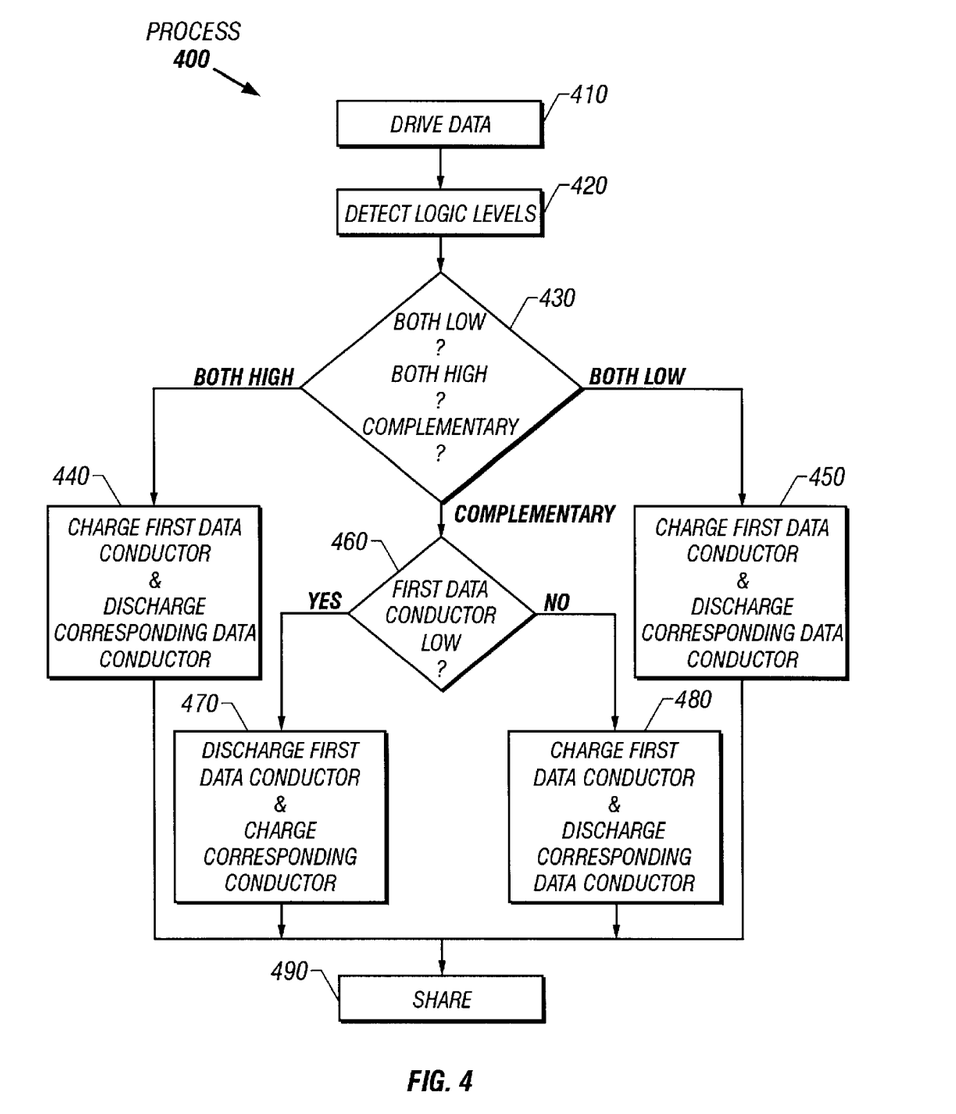
FIG. 4 is a flow chart illustrating a process for charge sharing in accordance with this invention.

FIG. 4 is a flow chart illustrating a process 400 for charge sharing in accordance with this invention. The charge sharing of process 400 described herein can be performed by the conductor pair 200 described above in connection with FIGS. 2–3 but should not be limited to such an embodiment. The charge sharing of process 400 can be employed in many types of integrated circuits, including processors. Process 400 starts with data being driven onto a first data conductor and a corresponding data conductor (410). The driving can be performed by drivers described above in connection with FIG. 2. Next, the logic levels (charge levels) of the first data conductor and the corresponding data conductor are detected by receivers (420). The detected signals are passed to control logic 228 and 228' of FIG. 2. The logic levels detected at step 420 are then compared (430). The comparison can be performed by control logic 228 and 228'. If the logic levels on the first data conductor and the corresponding data conductor are indicative of complementary charge levels, process 400 proceeds to block 460 of process 400. If the logic levels on the first data conductor and the corresponding data conductor are indicative of a low charge level, process 400 proceeds to block 450. If the logic levels on the first data conductor and the corresponding data conductor are indicative of a high charge level, process 400 proceeds to block 440.

The first data conductor is charged up to a higher charge level using the voltage supply (440). The corresponding data conductor is discharged to a lower charge level using system ground. Additionally, a charge signal is generated to charge up the first data conductor. One way for a charge signal to be used to charge up the first data conductor is by using the charge signal to turn on a switch that will create a conductive path between the first data conductor and the voltage supply. Furthermore, a discharge signal is generated to discharge the corresponding data conductor. One way for a discharge signal to be used to discharge the corresponding data conductor is by using the discharge signal to turn on a switch that will create a conductive path between the corresponding data conductor and the system ground. Examples of switches for charging and discharging have been described in connection with FIG. 2a. While in this embodiment the first data conductor is charged even though it is already at a high charge level, alternative embodiments may not charge the first data conductor. For the reason given above in connection with the operation of the apparatus of FIG. 2a, it is preferable to charge the first data conductor even though it is already at a high charge level.

The first data conductor is charged up to a higher charge level using the voltage supply at block 450 of process 400. The corresponding data conductor is discharged to a lower charge level using system ground. Additionally, a charge signal is generated that is used to charge up the first data conductor. Furthermore, a discharge signal is generated to discharge the corresponding data conductor. While in this embodiment the first data conductor is charged even though it is already at a low charge level, alternative embodiments may not charge the first data conductor. For the reason given above in connection with the operation of the apparatus of FIG. 2a, it is preferable to discharge the corresponding data conductor even though it is already at a low charge level.

It is determined whether the first data conductor has a low charge at block 460. If the first data conductor has a low charge level, the first data conductor is discharged to the system ground and the corresponding data conductor is charged to the voltage supply at block 470. Block 470 includes the step of generating a discharge signal for the first data conductor and generating a charge signal for the corresponding data conductor. If the first data conductor has a high charge level, the first data conductor is charged to the voltage supply and the corresponding data conductor is discharged to the system ground at block 480. Block 480 includes the step of generating a charge signal for charging the first data conductor and generating a discharge signal for discharging the corresponding data conductor.

At block 490, the charge on the first data conductor and the charge on the corresponding data conductor is shared. Block 490 also includes the step of generating a charge sharing signal for sharing charge between the first data conductor and the corresponding data conductor. The sharing can be performed by switches that turn on upon receipt of the charge sharing signal generated by control logic 228 or 228' of FIG. 2a.

Figure 5A:
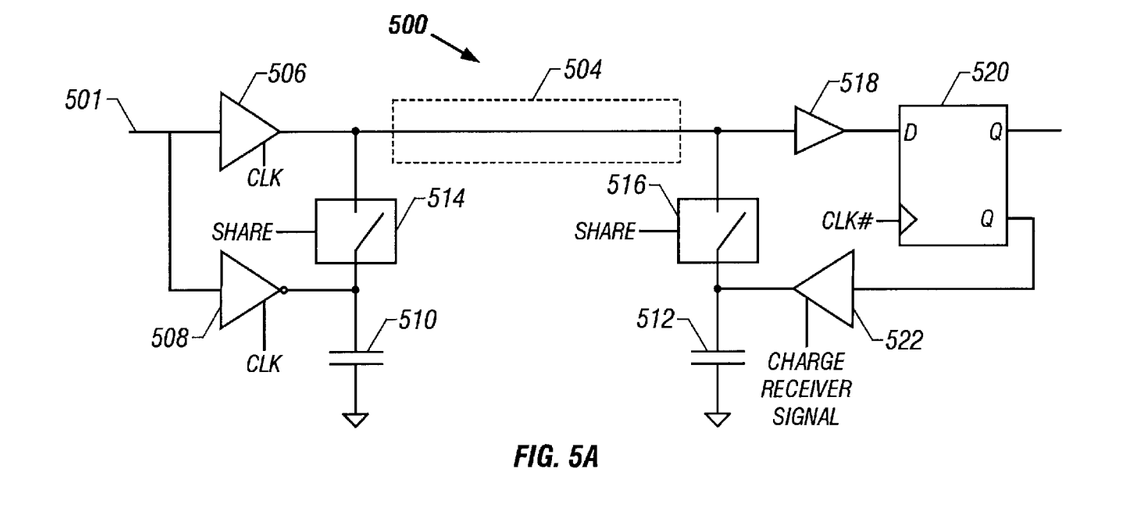
FIG. 5a is an electrical diagram in block form of a conductor configured for charge sharing in another embodiment of this invention.

FIG. 5a is an electrical diagram in block form of a conductor 500 configured for charge sharing in accordance with another embodiment of this invention. Conductor 500 is representative of a conductor in bus 106 or bus 114 of FIG. 1. While conductor 500 shows one conductor, it should be apparent that this invention is not limited to one conductor but can be used with any number of conductors. Conductor 500 includes a conductor 504, drivers 506, 508 and 522, capacitors 510 and 512, switches 514 and 516, receiver 518 and flip flop 520.

A functional unit, such as was described in connection with FIG. 1, applies data on data line 501, which communicates the data to driver 506. The complementary logic state of the data on data line 501 is produced at the output of driver 508. Drivers 506 and 508 each receive a clock signal generated by a clock generator (not shown) that enables the drivers, when the clock signal is high, to output the data received from data lines 501 and the complementary logic state of the data received on line 501, respectively. Driver 506 drives data received on data line 501 onto data conductor 504. Driver 508 charges or discharges capacitor 510 (driver or first equalizing capacitor)so as to put capacitor 510 in a logic state (or charge level) that is complementary to the logic state (or charge level) imposed on data conductor 504 by driver 506. Capacitor 510 is roughly equivalent to half the capacitance of data conductor 504, when two equalizing capacitors are used. However, in an alternative embodiment having n equalizing capacitors, the capacitance of an individual equalizing capacitor can be the capacitance of a data conductor divided by n. While only one driver equalizing capacitor is shown in FIG. 5a, alternative embodiments may have more equalizing capacitors. Receiver 518 receives the data applied to data conductor 504 and communicates it to flip flop 520. Flip flop 520 has an output Q that indicates the logic state of the data applied to data conductor 504. Flip flop 520 also has an output Q' that indicates the complementary logic state of the data applied to data conductor 504.

Figure 5B:
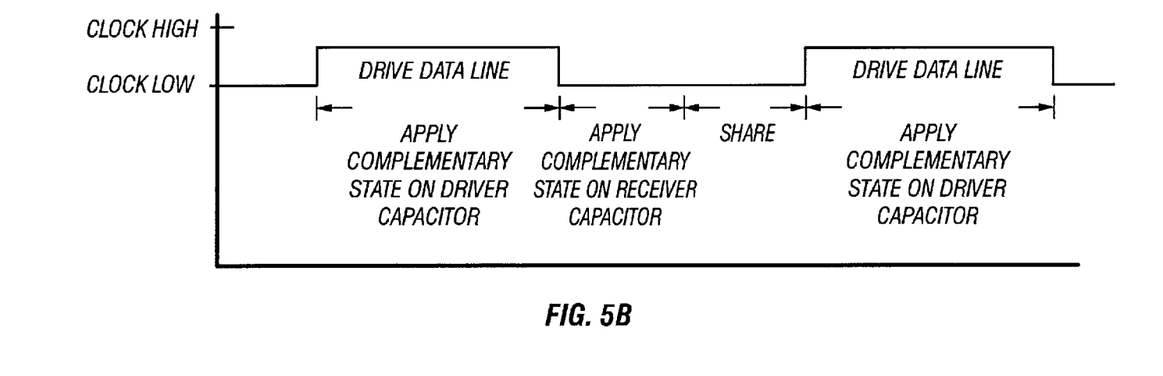
FIG. 5b illustrates a timing diagram for the operation of conductor configured for charge sharing in another embodiment of this invention.

FIG. 5b illustrates a timing diagram for the operation of conductor 500. When the clock is high, data is driven onto data conductor 504, and capacitor 510 is charged (or discharged). Driving data onto conductor 504 will either cause the voltage levels on the conductors to go to a high logic level or a low logic level. Typically, the high logic level is associated with high charge level meaning that the conductor has a relatively higher charge on it than the low charge level of the low logic level.

Flip flop 520 stores the state (or logic level) of the data placed by driver 506 onto conductor 504 while the clock was high, thereby allowing conductor 504 to be prepared for new data. Flip flop 520 can be part of a functional unit described in connection with FIG. 1. While conductor 504 is being prepared for new data, flip flop 520 provides the previous state of conductor 504 while the clock signal was clock high to a functional unit described in connection with FIG. 1.

Continuing with FIG. 5a, when the clock signal goes to clock low, a charge receiver signal generated by logic (not shown) is applied to driver 522. Output Q' of flip flop 520 is coupled to driver 522. Driver 522 drives capacitor 512 (second or receiver equalizing capacitor) such that the capacitor stores a charge indicative of the complementary logic state of data conductor 504. While only one receiver equalizing capacitor is shown in FIG. 5a, alternative embodiments may have more equalizing capacitors. After capacitor is driven to store a charge indicative of the complementary logic state of data conductor 504, switches 514 and 516 are activated so as to create conductive paths between conductor 504 and capacitors 510 and 512, respectively. It should be apparent that switches 514 and 516 can be NMOS transistors, PMOS transistors or a combination of both or some other type of switching device. The creation of conductive paths between the conductor and the capacitors allows charge to be shared among them. The duration of charge sharing is a function of the size/strength of switches 514 and 516, and the combined resistive and capacitive (RC) load of conductor 504, among other factors. The duration of charge sharing is also a function of the number of switches and capacitors used for charge sharing. For switches of equivalent size and capacitors of equivalent size, increasing numbers of switches and capacitors usually means relatively less time needed for charge sharing. Preferably, after charge sharing conductor 504 has a voltage that is close to the trip point of receiver 518. By having a voltage that is close to the trip point of receiver 518, conductor 504 can be rapidly and efficiently driven to the desired charge level (or voltage level) by driver 506.

FIG. 2c illustrates a circuit diagram representation of the electrical characteristics of conductor 504. The above description of the circuit diagram representation of a data conductor is incorporated here.

Figure 6:
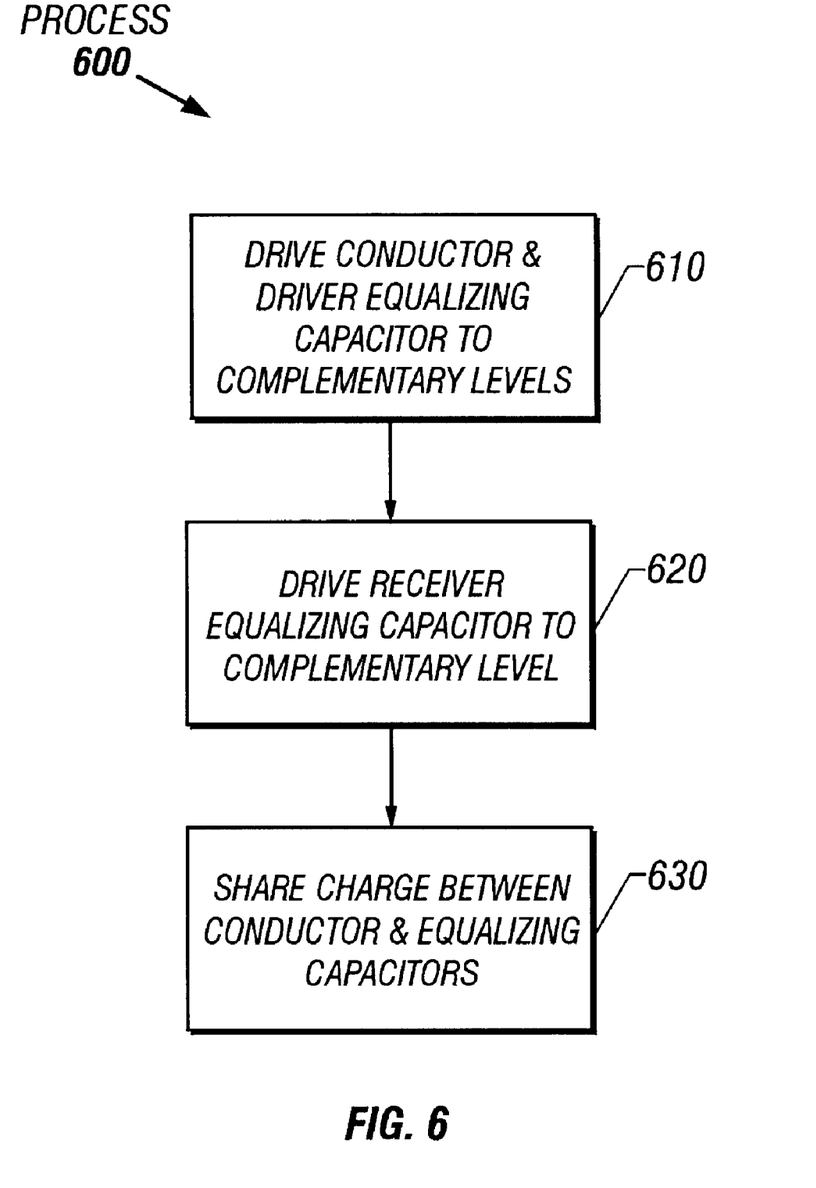
FIG. 6 is a flow chart illustrating a process for charge sharing in accordance with this invention.

FIG. 6 is a flow chart illustrating a process 600 for charge sharing in accordance with this invention. The charge sharing of process 600 described herein can be performed by the conductor 500 described above in connection with FIG. 5a but should not be limited to such an embodiment. At block 610 data is driven onto a first data conductor and a driver equalizing capacitor (first equalizing capacitor). The first data conductor 504 and capacitor 510 of FIG. 5a are possible examples of the first data conductor and the driver equalizing capacitor. The driving of block 610 can be performed by drivers 506 and 508 described above in connection with FIG. 5a. After driving, the first data conductor has a charge level that is complementary to the charge level of the driver equalizing capacitor. At block 620, a receiver equalizing capacitor (second equalizing capacitor) is driven to a charge level that is complementary to the charge level to which the first data conductor was driven. An example of a receiver equalizing capacitor is capacitor 512 of FIG. 5a. At block 630, charge is shared among the first data conductor and the receiver equalizing capacitor and the driver equalizing capacitor.

Since speed of an internal data bus has a very important influence on the performance of an integrated circuit, this invention provides a method and apparatus for increasing the speed without unnecessarily using precious die space. By sharing charge among the data conductors of the internal data bus die space is conserved. Alternatively, by sharing charge between a data conductor and an equalizing capacitor die space can be conserved.

Additionally, since power consumed by the internal data bus has a significant impact on the power budget of an integrated circuit, this invention provides a method and apparatus for decreasing the power consumed in charging the data conductors of an internal data bus. Power consumed in charging is decreased by charging only the data conductors and not having to charge dummy conductors. Power consumed in charging the data conductors is decreased because charging is only performed when both data conductors in a group have a low charge level.

Thus, a method and apparatus for sharing charge has been described. Although the present invention has been described with reference to specific exemplary embodiments, it will be evident that various modifications and changes may be made to these embodiments without departing from the broader spirit and scope the invention as set forth in the claims. Accordingly, the specification and drawings are to be regarded in an illustrative rather than a restrictive sense.

What is claimed is:

1. A method for charge sharing among data conductors of a bus, the method comprising:

detecting charge levels on a first data conductor and a corresponding data conductor; and generating a charge sharing signal to share charge between the first data conductor and the corresponding data conductor.

2. The method of claim 1, further comprising generating a charge signal.

3. The method of claim 2, further comprising charging the first data conductor using the charge signal.

4. The method of claim 1, further comprising generating a discharge signal.

5. The method of claim 4, further comprising discharging the first data conductor using the discharge signal.

6. The method of claim 2, further comprising:

generating a discharge signal;

charging the corresponding data conductor using the charge signal; and discharging the first data conductor using the discharge signal.

7. The method of claim 6, wherein charging occurs at at least two places along the corresponding data conductor.

8. The method of claim 6, wherein discharging occurs at at least two places along the first data conductor.

9. The method of claim 6, wherein the charging further comprises charging the corresponding data conductor using a driver coupled to the first data conductor.

10. The method of claim 6, wherein the discharging further comprises discharging the first data conductor using a driver coupled to the first data conductor.

11. The method of claim 6, further comprising sharing charge on the corresponding data conductor with the first data conductor using the charge sharing signal.

12. The method of claim 11, wherein sharing charge occurs at at least two locations along the first data conductor and the corresponding data conductor.

13. An apparatus for sharing charge among data conductors of a bus, comprising:

a bus having a first data conductor and a corresponding data conductor;

control logic coupled to the first data conductor and the corresponding data conductor; and wherein the control logic is to detect logic levels on the first data conductor and the corresponding data conductor and to generate a charge sharing signal to share charge between the first data conductor and the corresponding data conductor.

14. The apparatus of claim 13, further comprising:

at least one first switch coupled to the first data conductor and to the control logic; and wherein the control logic generates a second signal.

15. The apparatus of claim 14, wherein the second signal is a charge signal for application to the at least one first switch.

16. The apparatus of claim 15, wherein the first data conductor is to have a high charge level.

17. The apparatus of claim 14, wherein the second signal is a discharge signal for application to the at least one first switch.

18. The apparatus of claim 17, wherein the first data conductor is to have a low charge level.

19. The apparatus of claim 13, further comprising:

at least one driver coupled to the first data conductor and the control logic.

20. The apparatus of claim 19, wherein the control logic is to generate a second signal for application to the at least one driver; and wherein the second signal is a charge signal.

21. The apparatus of claim 20, wherein the first data conductor has a low charge level.

22. The apparatus of claim 14, further comprising:

at least one second switch coupled to the first data conductor and to the control logic.

23. The apparatus of claim 22, wherein the second signal is a discharge signal for application to the at least one second switch.

24. The apparatus of claim 23, further comprising:

at least one sharing switch coupled to the first data conductor and to the corresponding data conductor; and wherein the charge sharing signal is to be applied to the at least one sharing switch.

25. A method for charge sharing in a bus, the method comprising:

driving complementary charge levels on a first data conductor and at least one first equalizing capacitor, wherein the first data conductor has a first data conductor charge level;

generating a charge sharing signal;

sharing charge between the first data conductor and the at least one first equalizing capacitor using the charge sharing signal, wherein the sharing charge further comprises sharing charge between the first data conductor and at least one second equalizing capacitor; and driving a charge level on at least one second equalizing capacitor that is complementary to the first data conductor charge level.

26. An apparatus for sharing charge among data conductors of a bus, comprising:

a bus;

wherein the bus comprises a first data conductor and a first equalizing capacitor;

a driver coupled to the first data conductor;

a complementary driver coupled to the first equalizing capacitor;

wherein the first driver and the first complementary driver are to drive complementary charge levels on the first data conductor and the first equalizing capacitor, respectively;

a first switch coupled to the first data conductor and to the first equalizing capacitor;

control logic coupled to the first switch; and wherein the control logic is to generate a sharing signal for application to the first switch.

27. The apparatus of claim 26, further comprising:

a second equalizing capacitor coupled to the first data conductor;

a second complementary driver coupled to the second equalizing capacitor;

wherein the first data conductor has a first data conductor charge level;

wherein the second complementary driver is to receive an indication of the first data conductor charge level and is to drive the second equalizing capacitor to a charge level complementary to the first data conductor charge level a second switch coupled to the first data conductor, the second equalizing capacitor and the control logic; and wherein the second switch is to receive the sharing signal.

* * * * *